United States Patent
Guillon et al.

(10) Patent No.: US 9,984,948 B2
(45) Date of Patent: May 29, 2018

(54) HIGH VOLTAGE POWER ELECTRONICS MODULE FOR SUBSEA APPLICATIONS UNDER HIGH HYDROSTATIC PRESSURE AND TEMPERATURE VARIATIONS

(71) Applicant: ABB Schweiz AG, Baden (CH)

(72) Inventors: David Guillon, Vorderthal (CH); Heinz Lendenmann, Västerås (SE); Hui Huang, Stockholm (SE)

(73) Assignee: ABB Schweiz AG, Baden (CH)

( * ) Notice: Subject to any disclaimer, the term of this patent is extended or adjusted under 35 U.S.C. 154(b) by 0 days. days.

(21) Appl. No.: 15/586,928

(22) Filed: May 4, 2017

(65) Prior Publication Data

US 2017/0365535 A1 Dec. 21, 2017

(30) Foreign Application Priority Data

Jun. 15, 2016 (EP) .................... 16174555

(51) Int. Cl.
*H01L 23/29* (2006.01)
*H01L 23/06* (2006.01)
(Continued)

(52) U.S. Cl.
CPC ............. *H01L 23/29* (2013.01); *H01L 23/06* (2013.01); *H01L 23/3121* (2013.01); *H01L 29/7393* (2013.01); *H01L 23/051* (2013.01); *H01L 2224/48091* (2013.01); *H01L 2224/48227* (2013.01); *H01L 2224/48472* (2013.01); *H01L 2224/8592* (2013.01); *H01L 2924/1815* (2013.01)

(58) Field of Classification Search
CPC ..... H01L 23/295; H01L 23/296; H01L 23/29; H01L 23/06; H01L 29/7393
See application file for complete search history.

(56) References Cited

U.S. PATENT DOCUMENTS 5,292,688 A 3/1994 Hsiao et al.
9,035,446 B2 * 5/2015 Kimijima ................ H01L 23/42
257/687

(Continued)

FOREIGN PATENT DOCUMENTS

EP 0271872 A2 6/1988
EP 1142952 A1 10/2001
EP 1541567 A1 6/2005

OTHER PUBLICATIONS

Wong, C.P. et al: "Thermal Conductivity, Elastic Modulus, and Coefficient of Thermal Expansion of Polymer composites Filled with Ceramic Particles for Electronic Packaging", Journal of Applied Polymer Science, vol. 74, Published Apr. 19, 1999 8 Pages.

(Continued)

*Primary Examiner* — Andrew Q Tran
(74) *Attorney, Agent, or Firm* — Whitmyer IP Group LLC

(57) ABSTRACT

A power electronics module includes: a baseplate, a power semiconductor chip arranged on the baseplate, and an encapsulation structure arranged on the baseplate and configured to encapsulate the power semiconductor chip, wherein the encapsulation structure is an epoxy having an elastic modulus in a range of 1 to 20 Giga Pascal, GPa, at room temperature and a coefficient of thermal expansion less than 20 ppm/K.

17 Claims, 1 Drawing Sheet

(51) Int. Cl.
*H01L 29/739* (2006.01)
*H01L 23/31* (2006.01)
*H01L 23/051* (2006.01)

(56) References Cited

U.S. PATENT DOCUMENTS

| | | | |
|---|---|---|---|
| 9,093,448 B2 * | 7/2015 | Stapleton | ............... H01L 21/50 |
| 2006/0228562 A1 | 10/2006 | Ukawa et al. | |
| 2014/0024175 A1 | 1/2014 | Stapleton | |
| 2014/0319669 A1 | 10/2014 | Kimijima et al. | |

OTHER PUBLICATIONS

European Search Report Application No. 16174555.9 Completed: Aug. 17, 2016; dated Aug. 29, 2016 7 Pages.

* cited by examiner

HIGH VOLTAGE POWER ELECTRONICS MODULE FOR SUBSEA APPLICATIONS UNDER HIGH HYDROSTATIC PRESSURE AND TEMPERATURE VARIATIONS

TECHNICAL FIELD

The present disclosure generally relates to the field of high voltage power modules. In particular, it relates to a high voltage power electronics module for subsea applications.

BACKGROUND

Power semiconductor devices such as Insulated-Gate Bipolar Transistors (IGBT) have found use in a wide range of applications, for example as building blocks in power converters for high voltage applications.

An example of an IGBT power module is shown in US 2014/0319669 A1, which discloses a power module that includes a power semiconductor chip. The power module further includes a case that accommodates the power semiconductor chip. A silicone gel seals the power semiconductor chip within the case.

In recent years, there has been a growing interest in installing electrical installations on the sea floor in depths from a few tens of meters to even kilometers. Oil and gas production subsea employs electric equipment like drilling motors, pumps, and compressors driven by frequency converters.

In bringing power electronics subsea, two general concepts exist: (1) the equipment stays at or near atmospheric pressure in a pressure vessel; and (2) the equipment is pressurized to the hydrostatic pressure level on sea ground which can be several hundreds of bar. The two concepts can be differentiated as follows. Concept (1) has the advantage that standard electric/electronic components, known from onshore installations, can be used, while disadvantages include thick walls needed for the enclosure to withstand the pressure difference between inside and outside. Thick walls make the equipment heavy and costly. Concept (2) has the advantage that no thick walls are needed for the enclosure since the pressure difference between inside and outside the containment is much less than for concept (1).

A subsea module of concept type (2) is filled with a dielectric liquid such as oil, to counteract deformation of the subsea module enclosure and to provide adequate electrical insulation between electrical components contained in the subsea module.

SUMMARY

Silicone gel encapsulated power modules could theoretically be used in high pressure environments due to their mechanical deformability. In practice, however, silicone gel encapsulated power modules cannot be used in subsea modules of concept type (2) because the silicone gel would be dissolved in the dielectric fluid, resulting in power module failure.

Epoxy can generally be made compatible with dielectric fluids, but a problem with general epoxy enclosures is that in high pressure environments a very high tensile and shear stress concentrations would arise in the interface region between the baseplate of the power module and the epoxy encapsulation due to the extreme ambient hydrostatic pressure and because the baseplate and the encapsulation are made of different materials. This would be especially problematic for power modules for high voltage applications, because the physical dimensions of such a power module would be larger than for lower voltage modules. Hereto, general epoxy enclosures for high voltage power modules would crack if used in a high pressure environment.

In view of the above, a general object of the present disclosure is to provide a high voltage power electronics module for high pressure subsea applications.

Hence, according to a first aspect of the present disclosure there is provided a high voltage power electronics module for subsea applications, wherein the power electronics module comprises: a baseplate, a power semiconductor chip arranged on the baseplate, and an encapsulation structure arranged on the baseplate and configured to encapsulate the power semiconductor chip, wherein the encapsulation structure is an epoxy having an elastic modulus in a range of 1 to 20 Giga Pascal, GPa, at room temperature and a coefficient of thermal expansion less than 20 ppm/K.

By means of an encapsulation structure of epoxy having the above-indicated mechanical properties a power electronics module configured to be used for high voltage applications at very high pressures, e.g. at hydrostatic pressures in the order of hundreds of bar can be provided.

According to one embodiment the coefficient of thermal expansion is in the range of 10-12 ppm/K.

According to one embodiment the epoxy has a filler content of at least 75% by weight. The epoxy hence comprises at least 75% by weight of filler material. These properties of the epoxy would ensure compatible with dielectric fluid over a wide range of temperatures, for example between room temperature and up to 150° C., and could therefore beneficially be used in subsea modules of concept type (2) described hereabove.

With the epoxy and a dielectric fluid being compatible is meant the ability of the epoxy to withstand the dielectric fluid without changes in composition and properties, often called chemical resistance, and the ability of the dielectric fluid to withstand the epoxy without degradation and pollution.

According to one embodiment in any cross-section through the encapsulation structure, perpendicular to a plane defined by a surface of the baseplate on which the power semiconductor chip is arranged, the encapsulation structure has rounded inner corners.

According to one embodiment each rounded inner corners has a radius of at least 1 mm.

According to one embodiment in any cross-section through the encapsulation structure, perpendicular to a plane defined by a surface of the baseplate on which the power semiconductor chip is arranged, the encapsulation structure has rounded outer corners.

According to one embodiment each rounded outer corner has a radius of at least 1 mm.

According to one embodiment in said cross-section of the encapsulation structure any rounded inner corner and rounded outer corner is connected by an inclined line forming an outer boundary of the encapsulation structure.

According to one embodiment the outer angle between at least some inclined lines and said plane is an obtuse angle.

According to one embodiment the outer angle between at least some of the inclined lines and said plane is at least 100 degrees.

According to one embodiment the outer angle between at least some of the inclined lines and said plane is about 105 degrees.

According to one embodiment the power electronics module is configured to be operated on at least 1700 V.

According to one embodiment the power electronics module is an IGBT module.

According to a second aspect of the present disclosure there is provided a subsea module comprising: a flexible enclosure, a dielectric fluid for counteracting mechanical deformation of the flexible enclosure, and a high voltage power electronics module according to the first aspect, wherein the high voltage power electronics module is immersed in the dielectric fluid Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

Figure 1:
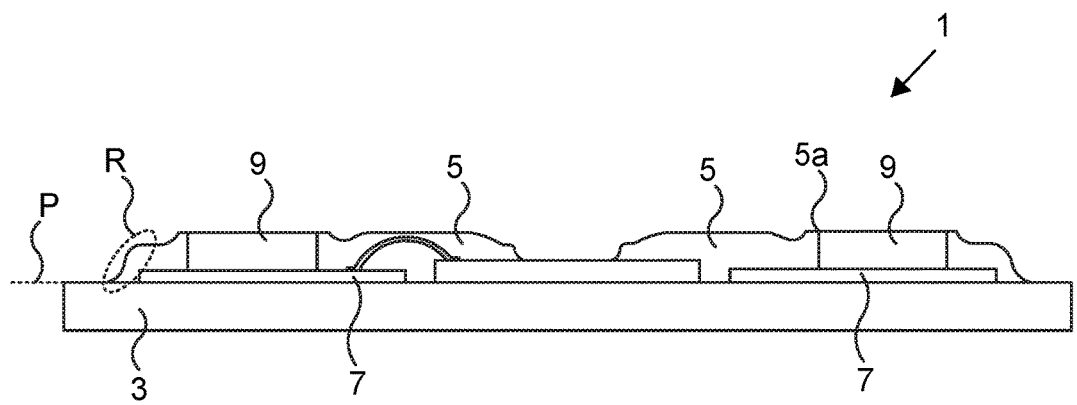
FIG. 1 schematically shows a cross-section of a high voltage power electronics module.

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

The present disclosure relates to a high voltage power electronics module, such as a high voltage power semiconductor module. Examples of such modules are IGBT modules, integrated gate-commutated thyristor (IGCT) modules, and thyristor modules. The high voltage power electronics module disclosed herein is especially adapted for high pressure environments, in particular subsea environments in which the module is subjected to ambient hydrostatic pressure. The high voltage power electronics module, in the following referred to as "power electronics module" includes a baseplate, a power semiconductor chip arranged on the baseplate, and an encapsulation structure. The encapsulation structure is also arranged on the baseplate, and configured to encapsulate the power semiconductor chip.

The encapsulation structure is an epoxy made relatively soft to endure high stress, in particular to reduce or eliminate the risk of cracks in the interface between the encapsulation structure and the baseplate. Hereto, the epoxy has an elasticity modulus not greater than 20 Giga Pascal at room temperature, for example not greater than 13 Giga Pascal at room temperature, such as not greater than to Giga Pascal at room temperature. The elasticity modulus is preferably also not smaller than 1 Giga Pascal at room temperature, preferably not smaller than 5 Giga Pascal at room temperature, for example not smaller than 7 Giga Pascal at room temperature. Should the elasticity module be too small, the epoxy becomes too soft, increasing the risk that it will not be compatible with a dielectric fluid, resulting in that the epoxy may dissolve in the dielectric fluid.

Moreover, the epoxy has a coefficient of thermal expansion that is less than 20 parts per million (ppm)/kelvin (K) below glass transition, for example less than 15 ppm/K, or 12 ppm/K, or about 11 ppm/K. With "about" 11 ppm/K is here meant a variation of plus/minus 1 ppm/K, thus meaning a range between 10 and 12 ppm/K. Moreover, the warpage of the epoxy is preferably less than 0.1%.

The coefficient of thermal expansion of the epoxy is preferably selected to be close to that of the baseplate material and to the material of the power semiconductor chip and any other material with which the encapsulation structure is in mechanical contact. According to one example, the baseplate may be made of Ni-plated 99.95% molybdenum, which has a coefficient of thermal expansion of about 5 ppm/K.

The epoxy preferably has low shrinkage during the manufacturing process of the encapsulation structure. The shrinkage is preferable about 1%. Hereto, in view of the above-defined mechanical properties of the encapsulation structure, the encapsulation structure is advantageously manufactured in a transfer moulding process.

The epoxy which the encapsulation structure is composed of is furthermore preferably compatible with a dielectric fluid such as organic oil over a wide range of temperatures. Hereto, the epoxy may comprise at least 75% by weight filler material, for example at least 80% by weight, at least 82% by weight or at least 84.5% by weight. This amount of filler material content leads to improvements in moisture absorption. The filler material may for example be silicone dioxide. Moreover, as mentioned above, compatibility with a dielectric fluid may be ensured in a wide temperature range, for example between room temperature and up to 150° C.

High voltage is herein defined as voltages starting at 600 V, for example 1200 V, such as 1700 V or higher voltages than 1700 V, e.g. 4600 V. The higher the voltage, the greater thermal stress on the epoxy and thus the probability of cracks in the interfaces between baseplate and the encapsulation structure.

By means of the above mechanical and chemical properties of the epoxy, the herein disclosed high voltage power electronics module is especially adapted for high pressure subsea applications in a dielectric fluid environment.

Figure 2:
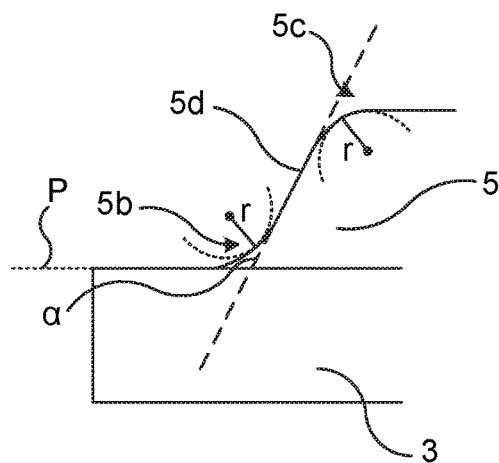
FIG. 2 schematically shows a close-up view of a portion of the cross-sectional view of the high voltage power electronics module in FIG. 1.

With reference to FIGS. 1 and 2, an example of a high voltage power electronics module comprising an encapsulation structure as described above will now be described.

FIG. 1 shows an example of a power electronics module 1 comprising a baseplate 3, at least one power semiconductor chip 7 arranged on the baseplate 3, and an encapsulation structure 5 arranged on the baseplate and configured to encapsulate the at least one power semiconductor chip 7. The exemplified encapsulation structure 5 has a plurality of openings 5a. The power electronics module 1 also includes a plurality of press-pins/preforms 9 provided in the openings 5a each enabling connection with a respective power semiconductor chip 7.

The cross-section shown in FIG. 1 is perpendicular to a plane P defined by that surface of the baseplate 3 on which the power semiconductor chip 7 is arranged. In any such cross-section, the encapsulation structure 5 has a design with rounded inner corners and rounded outer corners. The rounded inner corners are concave-shaped forming an indentation in the encapsulation structure 5. The rounded outer corners are convex-shaped forming a protuberance in the encapsulation structure 5.

In FIG. 1, a region R where the encapsulation structure 5 has rounded inner corners and rounded outer corners is marked by an ellipse. This region R is shown in more detail in FIG. 2. The radius r of a rounded inner corner 5b can for example be at least 1 mm, for example approximately 1 mm or equal to 1 mm, and the radius r of a rounded outer corner 5c can for example be at least 1 mm, for example approximately 1 mm or equal to 1 mm. In cross-section, between adjacent rounded inner corners 5b and rounded outer corners 5c there is an inclined line 5d. This inclined line 5d connects a rounded inner corner 5b and a rounded outer corner 5c, and forms an outer boundary of the encapsulation structure 5.

The outer angle α between the inclined line 5d and the plane P defined by the baseplate 3 is an obtuse angle. "Outer angle" is to be construed as the angle from the surface of the baseplate 3 on which the encapsulation structure 5 is arranged to the encapsulation structure 5, in particular the inclined line 5 which forms part of an outer surface of the encapsulation structure 5. For at least some of the inclined lines 5d, the outer angle α is preferably about 105°. In particular the angle α is preferably in the range 100° to 110°. The design with rounded inner corners 5b and rounded outer corners 5c, and inclined lines 5d connecting the rounded corners provides stress reduction of the power semiconductor chip(s) 7. It ensures that the power semiconductor chip 7 is able to survive high hydrostatic pressure and temperature variation conditions.

It may be noted that the preform design allows for a safer manufacturing process of the power electronics module. According to one variation, a preform is attached to the power semiconductor chip, e.g. the emitter, by for example soldering, concurrently with the power semiconductor chip being attached to the baseplate, for example by soldering. The encapsulation structure may then be provided onto the sub-assembly of the baseplate and power semiconductor chip in a transfer moulding procedure. The preform protects the power semiconductor chip in the manufacturing process.

The high voltage power electronics module disclosed herein may for example be a press-pack power module and the encapsulation structure may for example be used in an ABB® StakPak or in any equivalent or similar product.

The high voltage power electronics module may according to one application be arranged in a subsea module comprising a flexible enclosure for providing pressure compensation. The subsea module may furthermore comprise a dielectric fluid, such as oil, which fills the enclosure and restricts mechanical deformation of the enclosure. The high voltage power electronics module is arranged in the subsea module and immersed in the dielectric fluid. The encapsulation structure is hence in contact with the dielectric fluid. According to one variation, the subsea module may comprise a plurality of high voltage power electronics modules forming a subsea power converter.

It is envisaged that the high voltage power electronics module presented herein finds applications within the oil and gas industry for example for subsea HVDC/HVAC power provision systems, i.e. power transmission and power distribution systems, as well as offshore power generation such as wind energy, tidal energy, wave energy, and ocean current energy. A plurality of these high voltage power electronics modules may for example form part of a high voltage subsea power converter.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A high voltage power electronics module for subsea applications, wherein the power electronics module comprises:
a baseplate,
a power semiconductor chip arranged on the baseplate, and
an encapsulation structure arranged on the baseplate and configured to encapsulate the power semiconductor chip,
wherein the encapsulation structure is an epoxy having an elastic modulus in a range of 1 to 20 Giga Pascal, GPa, at room temperature and a coefficient of thermal expansion less than 20 ppm/K.

2. The power electronics module as claimed in claim 1, wherein the coefficient of thermal expansion is in the range of 10-12 ppm/K.

3. The power electronics module as claimed in claim 1, wherein the epoxy has a filler content of at least 75% by weight.

4. The power electronics module as claimed in claim 1, wherein in any cross-section through the encapsulation structure, perpendicular to a plane (P) defined by a surface of the baseplate on which the power semiconductor chip is arranged, the encapsulation structure has rounded inner corners.

5. The power electronics module as claimed in claim 4, wherein each of said rounded inner corners has a radius (r) of at least 1 mm.

6. The power electronics module as claimed in claim 4, wherein in said any cross-section through the encapsulation structure, perpendicular to said plane (P) defined by said surface of the baseplate on which the power semiconductor chip is arranged, the encapsulation structure has rounded outer corners.

7. The power electronics module as claimed in claim 6, wherein each of said rounded outer corners has a radius (r) of at least 1 mm.

8. The power electronics module as claimed in claim 6, wherein in said any cross-section through the encapsulation structure, each of said rounded inner corners is connected by an inclined line to one of said rounded outer corners, each inclined line forming an outer boundary of the encapsulation structure.

9. The power electronics module as claimed in claim 8, wherein an outer angle (α) between at least one of the inclined lines and said plane (P) is an obtuse angle.

10. The power electronics module as claimed in claim 9, wherein the outer angle (α) between at least one of the inclined lines and said plane (P) is at least 100 degrees.

11. The power electronics module as claimed in claim 9, wherein the outer angle (α) between at least one of the inclined lines and said plane (P) is about 105 degrees.

12. The power electronics module as claimed in claim 1, wherein the power electronics module is configured to be operated on at least 1700 V.

13. The power electronics module as claimed in claim 1, wherein the power electronics module is an IGBT module.

14. The power electronics module as claimed in claim 1, wherein in any cross-section through the encapsulation structure, perpendicular to a plane (P) defined by a surface of the baseplate on which the power semiconductor chip is arranged, the encapsulation structure has rounded outer corners.

15. The power electronics module as claimed in claim 14, wherein each of said rounded outer corner has a radius (r) of at least 1 mm.

16. A subsea module comprising:
a flexible enclosure,
a dielectric fluid for counteracting mechanical deformation of the flexible enclosure, and
a high voltage power electronics module immersed in the dielectric fluid, said power electronics module having:
a baseplate,
a power semiconductor chip arranged on the baseplate, and
an encapsulation structure arranged on the baseplate and configured to encapsulate the power semiconductor chip,
wherein the encapsulation structure is an epoxy having an elastic modulus in a range of 1 to 20 Giga Pascal, GPa, at room temperature and a coefficient of thermal expansion less than 20 ppm/K.

17. A high voltage power electronics module for a subsea application, wherein the power electronics module comprises:
a baseplate,
a power semiconductor chip arranged on the baseplate, the power semiconductor chip being configured to transmit high voltage in the subsea application, and
an encapsulation structure arranged on the baseplate and configured to encapsulate the power semiconductor chip, the encapsulation structure being an epoxy which has an elastic modulus in a range of 1 to 20 Giga Pascal, GPa, at room temperature and a coefficient of thermal expansion less than 20 ppm/K.

* * * * *